(12) United States Patent
Panigrahi (10) Patent No.: US 10,079,603 B1
(45) Date of Patent: Sep. 18, 2018

(54) CONFIGURABLE, MULTI-FUNCTIONAL DRIVER CIRCUIT

(71) Applicant: NXP B.V., Eindhoven (NL)

(72) Inventor: Chinmayee Kumari Panigrahi, Bangalore (IN)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 15/947,855

(22) Filed: Apr. 8, 2018

(51) Int. Cl.
  *H03K 19/0185* (2006.01)
  *H03K 5/13* (2014.01)
  *H04L 25/02* (2006.01)

(52) U.S. Cl.
  CPC ....... *H03K 19/018528* (2013.01); *H03K 5/13* (2013.01); *H03K 19/018585* (2013.01); *H04L 25/0282* (2013.01)

(58) Field of Classification Search
  None
  See application file for complete search history.

(56) References Cited

U.S. PATENT DOCUMENTS

| 6,480,026 | B2 | 11/2002 | Andrews |
| 6,856,178 | B1 * | 2/2005 | Narayan ........ H03K 19/018585 326/87 |
| 7,061,273 | B2 | 6/2006 | Wang |
| 7,215,143 | B1 | 5/2007 | Chung |
| 7,498,847 | B2 | 3/2009 | Park |
| 8,461,882 | B2 | 6/2013 | Chang |
| 8,841,936 | B2 | 9/2014 | Nakamura |
| 9,071,243 | B2 * | 6/2015 | Gondi ............ H03K 19/018557 |
| 9,240,784 | B2 * | 1/2016 | Gondi ............ H03K 19/018557 |
| 2016/0197598 | A1 * | 7/2016 | Wu .......................... H04B 1/04 327/108 |

* cited by examiner

Primary Examiner — Jany Richardson
(74) *Attorney, Agent, or Firm* — Charles E. Bergere (57) ABSTRACT

A driver circuit for an integrated circuit (IC) is configurable to operate in three different signaling modes, namely, differential signaling mode, single-ended current mode, and single-ended voltage mode. The driver circuit receives first and second input signals from a pre-driver and outputs first and second output signals that conform with the selected one of the three signaling modes.

20 Claims, 5 Drawing Sheets

CONFIGURABLE, MULTI-FUNCTIONAL DRIVER CIRCUIT

BACKGROUND

The present invention relates generally to integrated circuits, and, more particularly, to a configurable driver circuit that can operate in multiple signaling modes.

Driver circuits, or simply "drivers," transmit data in the form of electrical signals over various communication channels such as transmission lines, cables, printed circuit board traces, and integrated circuit traces. For example, drivers are used at the edges of integrated circuit to transmit signals generated on-chip to off-chip circuitry.

Drivers typically are designed to operate in a particular signaling mode, such as a single-ended voltage signaling mode, single-ended current signaling mode, or differential signaling mode. In the single-ended voltage and single-ended current signaling modes, the driver transmits the data as a varying voltage signal or a varying current signal over a single conductor, respectively. In differential signaling mode, the driver transmits the data as complementary signals over a pair of conductors.

Each driver has a specific design that enables it to operate in one of the signaling modes. Hence, to implement multiple signaling modes on the IC, output terminals of the drivers that operate in one of the aforementioned modes are multiplexed on a single input/output (IO) pad of the IC. However, multiplexing multiple drivers on the IO pad increases the load capacitance at the IO pad, which reduces the speed of the driver. Further, implementing multiple drivers consumes a significant amount of area. One solution for accommodating multiple signaling modes on an IC is to integrate the drivers on dedicated IO pads. However, having several such IO pads increases area and design complexity. Another solution is to have a driver that may be configured to operate in either single-ended or differential signaling mode. However, multiplexing different IO protocols comes with integration challenges and operational compatibility issues.

Therefore, it would be advantageous to have a configurable driver circuit that is not overly complex and does not consume excessive area.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In one embodiment, the present invention provides a driver configured to operate in a plurality of modes. The driver includes first and second sets of switches, first through fourth current sources, first through fourth current sinks, and first and second inverters. The first and second sets of switches receive a select input for enabling switching between first through third modes of the plurality of modes, and output first and second voltages, respectively. The first mode is a differential signaling mode, the second mode is a single-ended current signaling mode, and the third mode is a single-ended voltage signaling mode. The first and second current sources are connected to the first set of switches for receiving the first voltage. The first and second current sources are disabled in the second mode and enabled in the first and third modes. The first and second current sources output first and second currents in the first mode, and third and fourth voltages in the third mode, respectively. The third and fourth current sources receive a first predetermined bias voltage, and output third and fourth currents, respectively. The third and fourth current sources are enabled in the first through third modes. The first and second current sinks are connected to the second set of switches for receiving the second voltage. The first and second current sinks are disabled in the second mode and enabled in the first and third modes. The first and second current sinks sink fifth and sixth currents in the first mode, and output fifth and sixth voltages in the third mode, respectively. The third and fourth current sinks receive a second predetermined bias voltage and sink seventh and eighth currents, respectively. The third and fourth current sinks are enabled in the first through third modes. The first inverter is connected to the first and third current sources for receiving a first control signal, and to the first and third current sinks for receiving a second control signal. The first inverter also receives a first driver signal, and outputs at least one of the first control signal and the second control signal as a first output signal. The second inverter is connected to the second and fourth current sources for receiving a third control signal, and to the second and fourth current sinks for receiving a fourth control signal. The second inverter receives a second driver signal, and outputs at least one of the third control signal and the fourth control signal as a second output signal.

In another embodiment, the present invention provides an integrated circuit (IC) that includes a pre-driver and a driver. The pre-driver receives first and second input signals, and outputs first and second driver signals. The second driver signal is based on a third input signal. The driver is connected to the pre-driver for receiving the first and second driver signals, and outputs first and second output signals based on a select input. The driver is configured to operate in first through third modes. The first mode is a differential signaling mode, the second mode is a single-ended current signaling mode, and the third mode is a single-ended voltage signaling mode.

Various embodiments of the present invention provide a driver that is configured or programmed to operate in one of first through third modes, where the first mode is a differential signaling mode, the second mode is a single-ended current signaling mode, and the third mode is a single-ended voltage signaling mode. The driver includes first and second sets of switches, first through fourth current sources, first through fourth current sinks, and first and second inverters. The driver outputs first and second output signals based on first and second input signals. The first and second output signals are differential voltage signals, current signals, and voltage signals, respectively, depending on the signaling mode. The first and second output signals are derived from the first input signal in the first mode, and the first and second input signals, in the second and third modes, respectively.

The driver may be in an input/output (IO) ring of an integrated circuit (IC). As the driver can operate in all the aforementioned modes, the need for multiplexing outputs of multiple drivers onto an IO pad of the IC or integrating each driver on a dedicated IO pad of the IC is eliminated. Thus, the load capacitance at the IO pad due to the driver is significantly less than the load capacitance that would be due to multiplexing outputs of multiple drivers. Hence, the driver and the IC have a higher operating speed than conventional drivers and IC using conventional drivers. The driver consumes less area than providing separate circuits for each driver.

Figure 1:
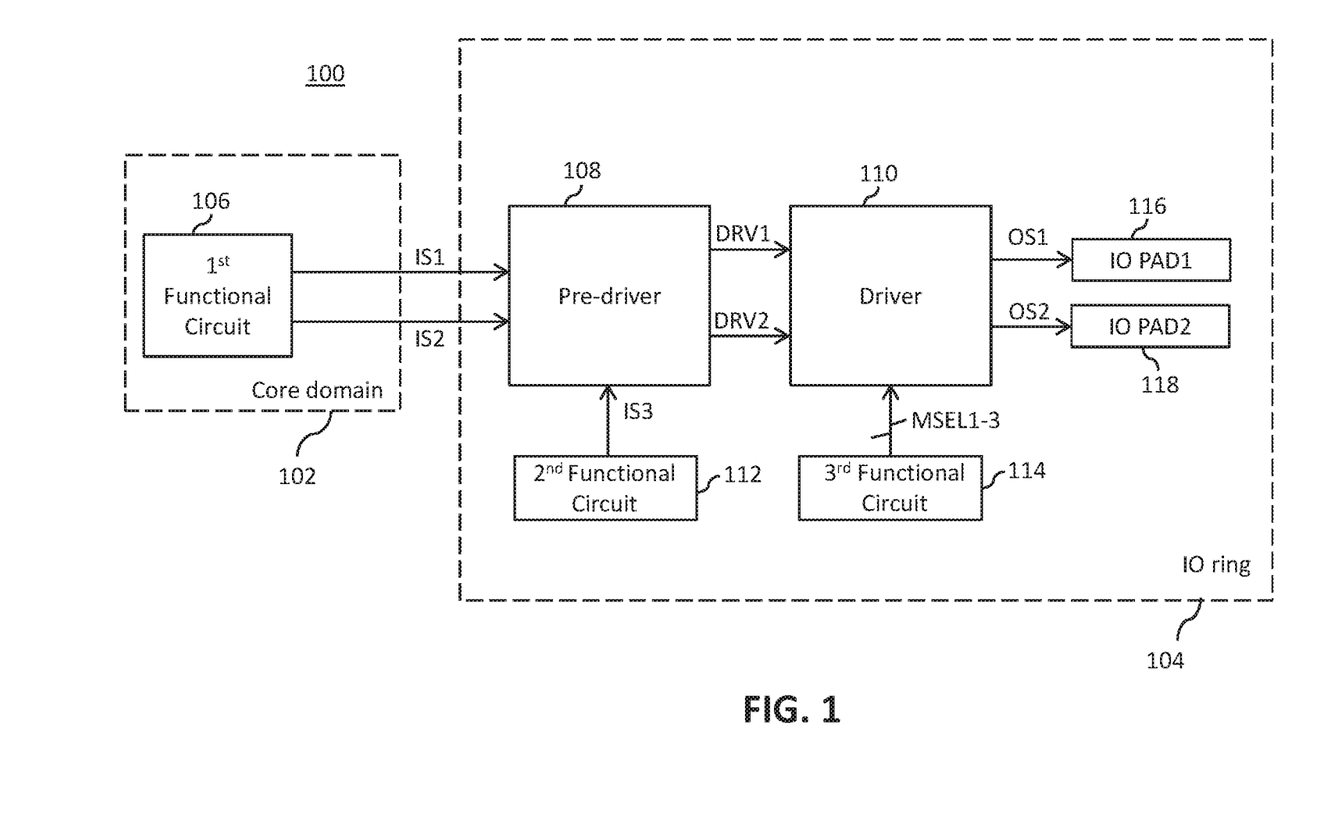
FIG. 1 is a schematic block diagram of an integrated circuit (IC) in accordance with an embodiment of the present invention.

Referring now to FIG. 1, a schematic block diagram of an integrated circuit (IC) 100 in accordance with an embodiment of the present invention is shown. The IC 100 includes a core domain 102 and an input/output (IO) domain 104, i.e., an IO ring.

The core domain 102 includes a first functional circuit 106 that generates first and second input signals IS1 and IS2, which are functional signals for communicating data to components (not shown) external to the IC 100.

The IO ring 104 provides an interface between the core domain 102 and the external components. The IO ring 104 receives the first and second input signals IS1 and IS2 from the core domain 102, and generates first and second output signals OS1 and OS2, which are provided to circuits external to the IC 100 by way of IO pads 116 and 118. The IO ring 104 also includes a pre-driver 108, a driver circuit 110 (hereinafter "driver 110"), and second and third functional circuits 112 and 114.

The pre-driver 108 is connected to the first functional circuit 106 and receives the first and second input signals IS1 and IS2 therefrom. The pre-driver circuit 108 also is connected to the second functional circuit 112 and receives a third input signal IS3, i.e., a select signal, therefrom. The third input signal IS3 enables the first mode in a first logic state, and enables the second and third modes in a second logic state. The pre-driver 108 amplifies the first and second input signals IS1 and IS2 and outputs first and second driver signals DRV1 and DRV2, respectively, in order to increase the voltage levels of the first and second input signals IS1 and IS2. The first driver signal DRV1 is an inverted and amplified version of the first input signal IS1 in the first through third modes, and the second driver signal DRV2 is either an inverted and amplified version of the second input signal IS2 or the amplified version of the first input signal IS1, depending on the logic state of the third input signal IS3.

The driver 110 is a multi-functional driver that is operable in multiple signaling modes, including first through third modes. In the presently preferred embodiment, the first mode is a differential signaling mode, the second mode is a single-ended current signaling mode, and the third mode is a single-ended voltage signaling mode. The driver 110 is connected to the pre-driver 108 and receives the first and second driver signals DRV1 and DRV2 therefrom. The driver 110 outputs the first and second output signals OS1 and OS2 to the IO pads 116 and 118. In the differential signaling mode, the first and second output signals OS1 and OS2 are differential signals having a common mode voltage. In the single-ended current signaling mode, the first and second output signals OS1 and OS2 are varying current signals. In the single-ended voltage signaling mode, the first and second output signals OS1 and OS2 are varying voltage signals.

The driver 110 also is connected to a third functional circuit 114 for receiving first through third select signals MSEL1-MSEL3 (collectively referred to as a "select input"). In one embodiment, the third functional circuit 114 includes a decoder (not shown) that generates the first through third select signals MSEL1-MSEL3. The driver 110 operates in one of the first through third modes based on the logic states of the first through third select signals MSEL1-MSEL3.

The first and second IO pads 116 and 118 are connected to the driver 110 and receive the first and second output signals OS1 and OS2, respectively. The first and second IO pads 116 and 118 are conventional circuits for communicating the first and second output signals OS1 and OS2 to components external to the IC 100.

Figure 2:
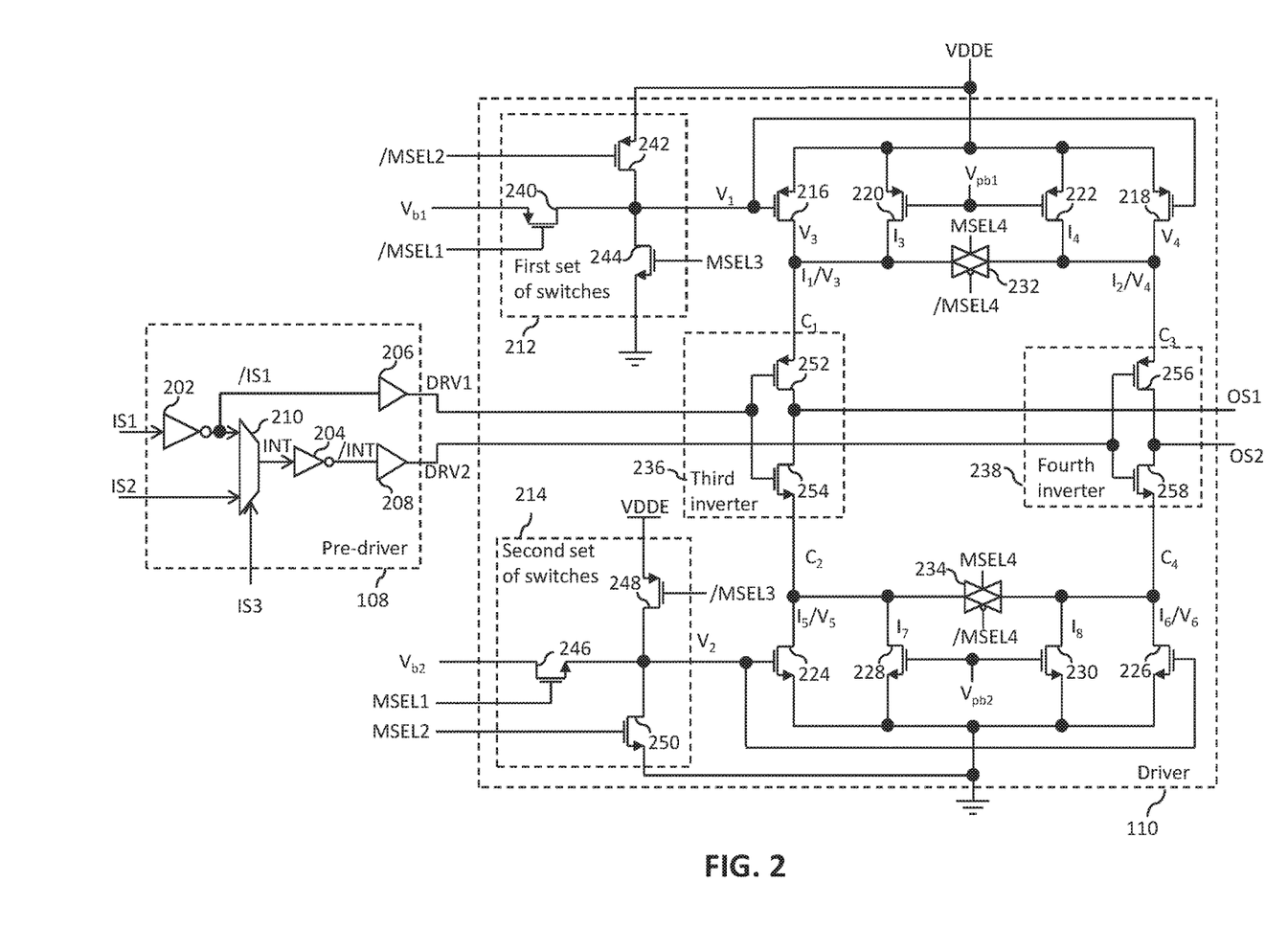
FIG. 2 is a schematic circuit diagram of a pre-driver and a driver of the IC of FIG. 1 in accordance with an embodiment of the present invention.

Referring now to FIG. 2, a schematic circuit diagram of the pre-driver 108 and the driver 110 of the IC 100 in accordance with an embodiment of the present invention is shown. The pre-driver 108 includes first and second inverters 202 and 204, first and second amplifiers 206 and 208, and a multiplexer 210.

The first inverter 202 is connected to the first functional circuit 106 and receives the first input signal IS1, and outputs an inverted version of the first input signal /IS1. The first amplifier 206 is connected to the first inverter 202 and receives /IS1 and outputs the first driver signal DRV1. Thus, the first driver signal DRV1 is an amplified and inverted version of the first input signal IS1.

The multiplexer 210 is a 2:1 multiplexer having a first input connected to the first inverter 202 for receiving /IS1, a second input connected to the first functional circuit 106 for receiving the second input signal IS2, and a select input connected to the second functional circuit 112 for receiving the third input signal IS3. In one embodiment, the third input signal IS3 is an OR of the second and third select signals MSEL2 and MSEL3. The multiplexer 210 outputs an intermediate signal INT, which is equal to either /IS1 or IS2 depending on the logic state of the control input IS3.

The second inverter 204 is connected to the multiplexer 210 and receives the intermediate signal INT and outputs an inverted version thereof /INT. The second amplifier 208 is connected to the second inverter 204 and receives /INT therefrom. The second amplifier 208 outputs the second driver signal DRV2, which is an amplified version of /INT.

It will be understood by a person skilled in the art that the pre-driver 108 is just one implementation of a pre-driver and other pre-driver circuit implementations may be used in the present invention.

The driver 110 includes first and second sets of switches 212 and 214, first through fourth current sources 216-222, first through fourth current sinks 224-230, first and second transmission gates 232 and 234, and third and fourth inverters 236 and 238.

The first and second sets of switches 212 and 214 receive the select input, i.e., the first through third select signals MSEL1-MSEL3, from the third functional circuit 114 to enable switching between the first through third operational modes.

The first set of switches 212 includes first through third switches 240-244. The first switch 240 has a first terminal for receiving an inverted version of the first select signal MSEL1, hereinafter referred to as "/MSEL1". It will be apparent to a person skilled in the art that /MSEL1 is generated by the third functional circuit 114 or by an inverter (not shown) that receives the first select signal MSEL1. Similarly, inverted versions of the second and third select signals MSEL2 and MSEL3, hereinafter referred to as "/MSEL2" and "/MSEL3", respectively, are generated by inverters, which may or may not be part of the third functional circuit 114. The first switch 240 has a second terminal that receives a first bias voltage $V_{b1}$. The first bias voltage $V_{b1}$ is at an intermediate voltage level between a voltage level of a supply voltage VDDE and ground. In one embodiment, a first bias generator (not shown) generates the first bias voltage $V_{b1}$. In another embodiment, a common mode feedback (CMFB) circuit (not shown) generates the first bias voltage $V_{b1}$. The common mode feedback (CMFB) circuit may include an operational amplifier and resistors for maintaining a stable common mode voltage (i.e., $V_{b1}$) over variations of process, the supply voltage VDDE, and temperature (PVT).

The second switch 242 has a first terminal that receives /MSEL2, and a second terminal that receives the supply voltage VDDE. The third switch 244 has a first terminal connected to the third functional circuit 114 for receiving the third select signal MSEL3, and a second terminal connected to ground. The third switch 244 also has a third terminal, connected to third terminals of the first and second switches 240 and 242, for outputting a first voltage $V_1$, which is provided to the first and second current sources 216 and 218.

In the first signaling mode, the first voltage $V_1$ equals the first bias voltage $V_{b1}$, as will be explained with reference to FIG. 3. In the second signaling mode, the first voltage $V_1$ equals the supply voltage VDDE, as will be explained with reference to FIG. 4. In the third signaling mode, the first voltage $V_1$ equals ground, as will be explained with reference to FIG. 5. In one embodiment, the first and second switches 240 and 242 are p-channel metal oxide semiconductor (PMOS) transistors and the third switch 244 is an n-channel (N) MOS transistor.

The second set of switches 214 includes fourth through sixth switches 246-250. The fourth switch 246 has a first terminal connected to the third function circuitry 114 for receiving the first select signal MSEL1, and a second terminal that receives a second bias voltage $V_{b2}$. The second bias voltage $V_{b2}$ is at an intermediate voltage level between the supply voltage VDDE and ground. The second bias voltage $V_{b2}$ may be generated by a second bias generator (not shown), or with a common mode feedback (CMFB) circuit (not shown). The fifth switch 248 has a first terminal for receiving /IMSEL3, and a second terminal for receiving the supply voltage VDDE. The sixth switch 250 has a first terminal connected to the third functional circuit 114 for receiving the second select signal MSEL2, and a second terminal connected to ground. The sixth switch 250 has a third terminal connected to third terminals of the fourth and fifth switches 246 and 248 for outputting a second voltage $V_2$, which is provided to the first and second current sinks 224 and 226.

In the first signaling mode, the second voltage $V_2$ equals the second bias voltage $V_{b2}$, as will be explained with reference to FIG. 3. In the second signaling mode, the second voltage $V_2$ equals ground, as will be explained with reference to FIG. 4. In the third signaling mode, the second voltage $V_2$ equals the supply voltage VDDE, as will be explained with reference to FIG. 5. In one embodiment, the fourth and sixth switches 246 and 250 are NMOS transistors, and the fifth switch 248 is a PMOS transistor.

The first and second current sources 216 and 218 have first terminals connected to the first set of switches 212 for receiving the first voltage $V_1$, and second terminals for receiving the supply voltage VDDE. In one embodiment, the first and second current sources 216 and 218 are PMOS transistors.

In the first signaling mode, the first and second current sources 216 and 218 are enabled by the first voltage $V_1$ and output first and second currents $I_1$ and $I_2$ at third terminals, respectively. In one example, current levels of the first and second currents $I_1$ and $I_2$ are at 1.25 milliampere (mA). In the second signaling mode, the first and second current sources 216 and 218 are disabled. In the third signaling mode, the first and second current sources 216 and 218 are enabled by the first voltage $V_1$ and output third and fourth voltages $V_3$ and $V_4$ at their third terminals, respectively. In an example, voltage levels of the third and fourth voltages $V_3$ and $V_4$ are equal.

The third and fourth current sources 220 and 222 have first terminals connected to the first bias generator for receiving a first predetermined bias voltage $V_{pb1}$, and second terminals for receiving the supply voltage VDDE. In one embodiment, the third and fourth current sources 220 and 222 are PMOS transistors.

The first predetermined bias voltage $V_{pb1}$ is at an intermediate voltage level between the supply voltage VDDE and ground. The third and fourth current sources 220 and 222 are enabled in the first through third modes. The third and fourth current sources 220 and 222 have third terminals that output third and fourth currents $I_3$ and $I_4$, respectively, in the first through third modes. In one example, current levels of the third and fourth currents $I_3$ and $I_4$ are at 0.5 mA.

The first and second current sinks 224 and 226 have first terminals connected to the second set of switches 214 for receiving the second voltage $V_2$, and second terminals connected to ground. In one embodiment, the first and second current sinks 224 and 226 are NMOS transistors.

In the first mode, the first and second current sinks 224 and 226 are enabled and sink fifth and sixth currents $I_5$ and $I_6$ at third terminals thereof, respectively. In one example, current levels of the fifth and sixth currents $I_5$ and $I_6$ are at 1.25 mA. In the second mode, the first and second current sinks 224 and 226 are disabled. In the third mode, the first and second current sinks 224 and 226 are enabled and output fifth and sixth voltages $V_5$ and $V_6$ at their third terminals, respectively. In an example, voltage levels of the fifth and sixth voltages $V_5$ and $V_6$ are equal.

The third and fourth current sinks 228 and 230 have first terminals (e.g., gate terminals) connected to the second bias generator for receiving a second predetermined bias voltage $V_{pb2}$, and second terminals connected to ground. In one embodiment, the third and fourth current sinks 228 and 230 are NMOS transistors.

The second predetermined bias voltage $V_{pb2}$ is at an intermediate voltage level between the voltage level of the supply voltage VDDE and ground. The third and fourth current sinks 228 and 230 are enabled in the first through third modes. The third and fourth current sinks 228 and 230 have third terminals that sink seventh and eighth currents $I_7$ and $I_8$, respectively, in the first through third modes. In one example, current levels of the seventh and eighth currents $I_7$ and $I_8$ are at 0.5 mA.

The first transmission gate 232 is connected between the third terminals of the third and fourth current sources 220 and 222. The first transmission gate 232 receives a fourth select signal MSEL4 and its complement /MSEL4. In one embodiment, the fourth select signal MSEL4 is generated by NORing the second and third select signals MSEL2 and MSEL3, i.e., an inverted version of the third input signal IS3. The second transmission gate 234 is connected between the third terminals of the third and fourth current sinks 228 and 230. Like the first transmission gate 232, the second transmission gate 234 receives the fourth select signal MSEL4 and its complement /MSEL4. It will be apparent to a person skilled in the art that the fourth select signal MSEL4 is generated in a manner similar to the first through third select signals MSEL1-MSEL3.

The third inverter 236 has a first terminal connected to the pre-driver 108 for receiving the first driver signal DRV1, a second terminal connected to the third terminals of the first and third current sources 216 and 220 for receiving a first control signal $C_1$, and a third terminal connected to the third terminals of the first and third current sinks 224 and 228 for receiving a second control signal C2. The third inverter 236 outputs the first output signal OS1 to the first IO pad 116.

In one embodiment, the third inverter 236 comprises a pair of complementary metal oxide semiconductor (CMOS) transistors 252 and 254 (referred to as first and second transistors 252 and 254) having their gates connected together, and their drains connected together. The first transistor 252 has a gate connected to the pre-driver 108 for receiving the first driver signal DRV1, and a source connected to the third terminals of the first and third current sources 216 and 220 for receiving the first control signal $C_1$. The second transistor 254 has a gate connected to the pre-driver 108 for receiving the first driver signal DRV1, a source connected to the third terminals of the first and third current sinks 224 and 228 for receiving the second control signal $C_2$, and a drain connected to a drain of the first transistor 252 for outputting the first output signal OS1. The first and second transistors 252 and 254 are PMOS and NMOS transistors, respectively.

The fourth inverter 238 has a first terminal connected to the pre-driver 108 for receiving the second driver signal DRV2, a second terminal connected to the third terminals of the second and fourth current sources 218 and 222 for receiving a third control signal $C_3$, and a third terminal connected to the third terminals of the second and fourth current sinks 226 and 230 for receiving a fourth control signal $C_4$. The fourth inverter 238 has an output terminal for outputting the second output signal OS2 to the second IO pad 118.

In one embodiment, the fourth inverter 238, like the third inverter 236, comprises a CMOS pair referred to herein as third and fourth transistors 256 and 258. The third transistor 256 has a gate connected to the pre-driver 108 for receiving the second driver signal DRV2, and a source connected to the third terminals of the second and fourth current sources 218 and 222 for receiving the third control signal $C_3$. The fourth transistor 258 has a gate connected to the pre-driver 108 for receiving the second driver signal DRV2, a source connected to the third terminals of the second and fourth current sinks 226 and 230 for receiving the fourth control signal $C_4$, and a drain connected to the drain of the third transistor 256 for outputting the second output signal OS2. The third and fourth transistors 256 and 258 are PMOS and NMOS transistors, respectively.

Figure 3:
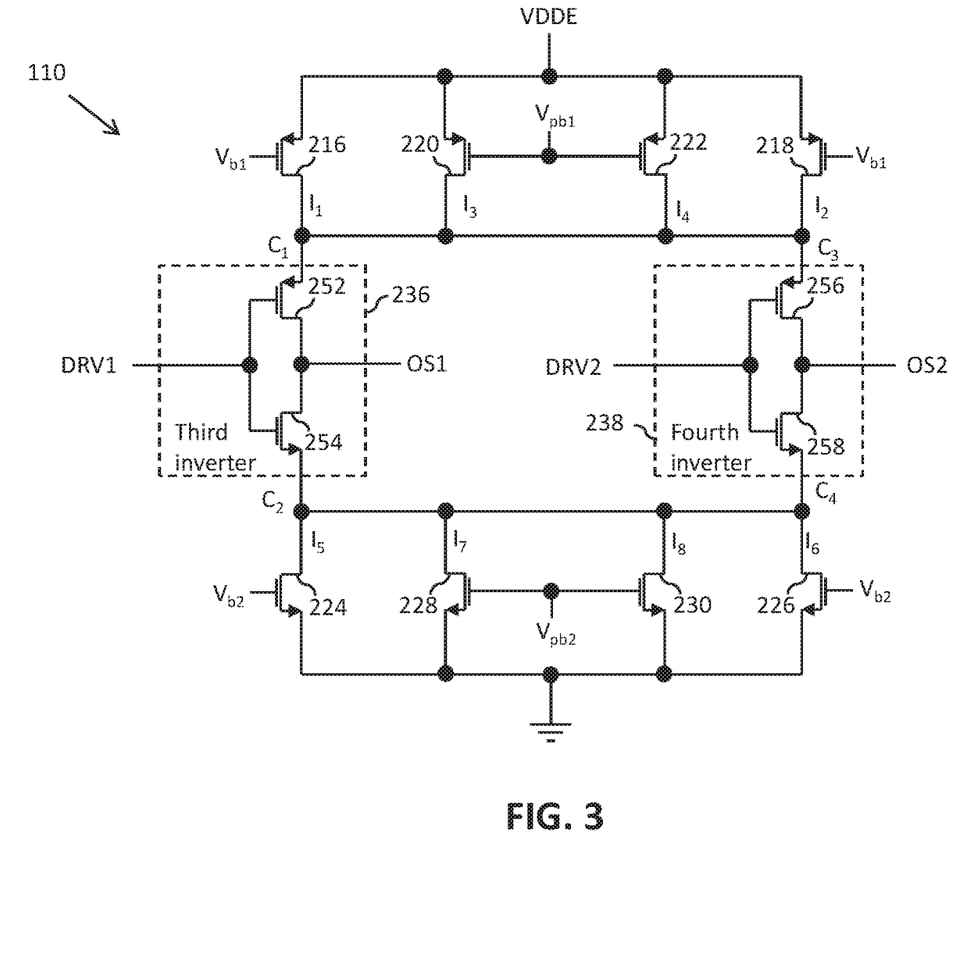
FIG. 3 is a schematic circuit diagram of the driver of FIG. 2 operating in a first mode, i.e., a differential signaling mode, in accordance with an embodiment of the present invention.

Referring now to FIG. 3, a functional, schematic circuit diagram of the driver 110 operating in the first mode, i.e., the differential signaling mode, in accordance with an embodiment of the present invention, is shown. In the first mode, the first and second input signals IS1 and IS2 may be transmitted using various protocols such as, a High Voltage Differential Signaling (HVDS) protocol, a Current Mode Logic (CML) protocol, a Scalable Low Voltage Signaling (SLVS) protocol, a Low Voltage Differential Signaling (LVDS) protocol, and the like.

In the LVDS protocol, the first select signal MSEL1 is active and the second and third select signals MSEL2 and MSEL3 are inactive. Hence, the first switch 240 is enabled, and the second and third switches 242 and 244 are disabled. Thus, the voltage level of the first voltage $V_1$ is at the voltage level of the first bias voltage $V_{b1}$ ($V_1=V_{b1}$), so the first and second current sources 216 and 218 output the first and second currents $I_1$ and $I_2$, respectively, and the third and fourth current sources 220 and 222 are enabled and output the third and fourth currents $I_3$ and $I_4$, respectively. Similarly, in the second set of switches 214, the fourth switch 246 is enabled, and the fifth and sixth switches 248 and 250 are disabled. Thus, the voltage level of the second voltage $V_2$ is at the voltage level of the second bias voltage $V_{b2}$ ($V_2=V_{b2}$), so the first and second current sinks 224 and 226 sink the fifth and sixth currents $I_5$ and $I_6$, respectively, and the third and fourth current sinks 228 and 230 are enabled and sink the seventh and eighth currents $I_7$ and $I_8$, respectively.

As the fourth select signal MSEL4 is the NOR of the second and third select signals MSEL2 and MSEL3, the fourth select signal MSEL4 is active and /MSEL4 is inactive. Hence, the first and second transmission gates 232 and 234 are enabled such that a current path is established between the third terminals of the first through fourth current sources 216-222. As the first through fourth current sources 216-222 are connected in parallel, current levels of the first and third control signals $C_1$ and $C_3$ are equal to a sum of current levels of the first through fourth currents $I_1$-$I_4$. In one example, the sum of the current levels of the first through fourth currents $I_1$-$I_4$ is 3.5 mA. Further, as the first through fourth current sinks 224-230 are connected in parallel, current levels of the second and fourth control signals $C_2$ and $C_4$ are equal to a sum of current levels of the fifth through eighth currents $I_5$-$I_8$. In one example, the sum of the current levels of the fifth through eighth currents $I_5$-$I_8$ is 3.5 mA.

In the LVDS protocol, the third input signal IS3 is low, so the pre-driver 108 outputs /IS1 as the first driver signal DRV1, and IS1 as the second driver signal DRV2. Thus, the first and second driver signals DRV1 and DRV2 are based on the first input signal IS1. And it is noted that here the first driver signal DRV1 is an inverted version of the second driver signal DRV2.

When the first input signal IS1 is high, the first driver signal DRV1 is low and the second driver signal DRV2 is high. Hence, the first and fourth transistors 252 and 258 are enabled and the second and third transistors 254 and 256 are disabled. Thus, the third inverter 236 outputs the first control signal $C_1$ as the first output signal OS1, and the fourth inverter 238 outputs the fourth control signal $C_4$ as the second output signal OS2.

When the first input signal IS1 is low, the first driver signal DRV1 is high and the second driver signal DRV2 is low. Hence, the first and fourth transistors 252 and 258 are disabled and the second and third transistors 254 and 256 are enabled. Thus, the third inverter 236 outputs the second control signal $C_2$ as the first output signal OS1, and the fourth inverter 238 outputs the third control signal $C_3$ as the second output signal OS2. It will be apparent to a person skilled in the art that when the first and second output signals OS1 and OS2 pass through a resistor (not shown) connected between the first and second IO pads 116 and 118, the first and second output signals OS1 and OS2 are generated as differential voltage signals. In an example, the resistor is a 100 ohm resistor. Thus, the first and second output signals OS1 and OS2 that pass through the resistor generate a differential voltage swing of 350 millivolts (mV) with opposite polarities. It will be apparent to a person skilled in the art that although the LVDS protocol is explained in FIG. 3, any other protocols of the differential signaling mode can be implemented using the driver 110.

Figure 4:
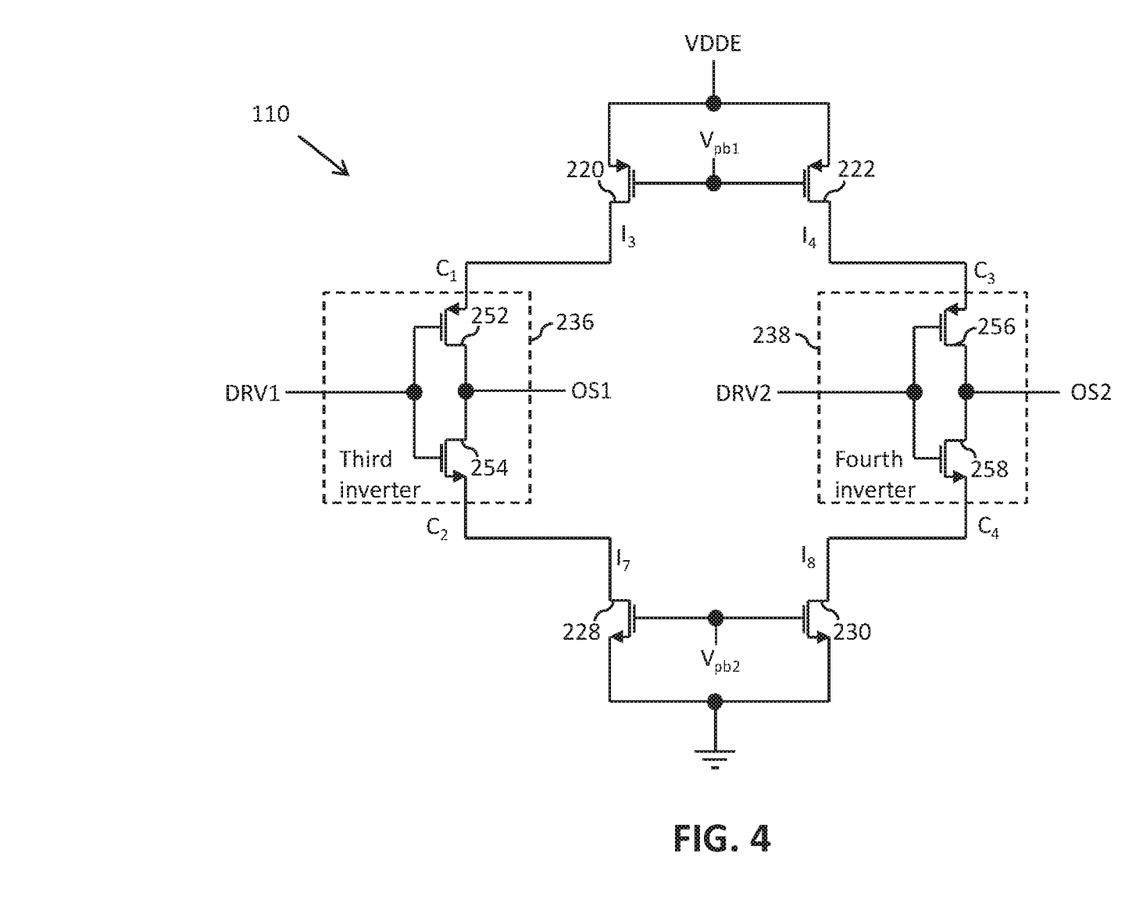
FIG. 4 is a schematic circuit diagram of the driver of FIG. 2 operating in a second mode, i.e., a single-ended current signaling mode, in accordance with an embodiment of the present invention.

Referring now to FIG. 4, a schematic circuit diagram of the driver 110 operating in the second mode, i.e., the single-ended current signaling mode, in accordance with an embodiment of the present invention, is shown. In the second mode, the first and second input signals IS1 and IS2 may be transmitted using an inter-IC sound (I2S) protocol. As should be understood by those of skill in the art, I2S is an electrical serial bus interface standard used for connecting digital audio devices together.

In the I2S protocol, the second select signal MSEL2 is active and the first and third select signals MSEL1 and MSEL3 are inactive. Thus, the second switch 242 is enabled, and the first and third switches 240 and 244 are disabled, so the voltage level of the first voltage $V_1$ is at the voltage level of the supply voltage VDDE. When the first voltage $V_1$ equals the supply voltage VDDE, the first and second current sources 216 and 218 are disabled, and the third and fourth current sources 220 and 222 are enabled and output the third and fourth currents $I_3$ and $I_4$, respectively.

The sixth switch 250 is enabled, and the fourth and fifth switches 246 and 248 are disabled. Thus, the voltage level of the second voltage $V_2$ is at ground. When the second voltage $V_2$ is at ground, the first and second current sinks 224 and 226 are disabled, and the third and fourth current sinks 228 and 230 are enabled and sink the seventh and eighth currents $I_7$ and $I_8$, respectively.

Since the second and third select signals MSEL2 and MSEL3 are inactive, the fourth select signal MSEL4 is inactive and /MSEL4 is active. Hence, the first and second transmission gates 232 and 234 are disabled, so there is no current path between the third terminal of the third current source 220 and the third terminal of the fourth current source 222. Further, there is no current path between the third terminal of the third current sink 228 and the third terminal of the fourth current sink 230.

Since the first and second current sources 216 and 218 are disabled, the current levels of the first and third control signals $C_1$ and $C_3$ are equal to the current levels of the third and fourth currents $I_3$ and $I_4$, respectively. Similarly, since the first and second current sinks 224 and 226 are disabled, the current levels of the second and fourth control signals $C_2$ and $C_4$ are equal to the current levels of the seventh and eighth currents $I_7$ and $I_8$, respectively.

In the I2S protocol, the third input signal IS3 is high, hence the first driver signal DRV1 equals /IS1, and the second driver signal DRV2 equals /IS2. Thus, the first and second driver signals DRV1 and DRV2 are independent of each other.

When the first input signal IS1 is active, the first driver signal DRV1 is inactive. Hence, the first transistor 252 is enabled and the second transistor 254 is disabled. Thus, the third inverter 236 outputs the first control signal $C_1$ as the first output signal OS1. When the first input signal IS1 is inactive, the first driver signal DRV1 is active. Hence, the first transistor 252 is disabled and the second transistor 254 is enabled. Thus, the third inverter 236 outputs the second control signal $C_2$ as the first output signal OS1.

When the second input signal IS2 is active, the second driver signal DRV2 is inactive. Hence, the third transistor 256 is enabled and the fourth transistor 258 is disabled. Thus, the fourth inverter 238 outputs the third control signal $C_3$ as the second output signal OS2. When the second input signal IS2 is inactive, the second driver signal DRV2 is active. Hence, the third transistor 256 is disabled and the fourth transistor 258 is enabled. Thus, the fourth inverter 238 outputs the fourth control signal $C_4$ as the second output signal OS2. Thus, the first and second output signals OS1 and OS2 are varying current signals.

In an example, current levels of the first and second output signals OS1 and OS2 are at 0.5 mA. Although, the I2S protocol is explained in FIG. 4, it will be apparent to a person skilled in the art that any other protocols of the single-ended current signaling mode can be implemented using the driver 110.

Figure 5:
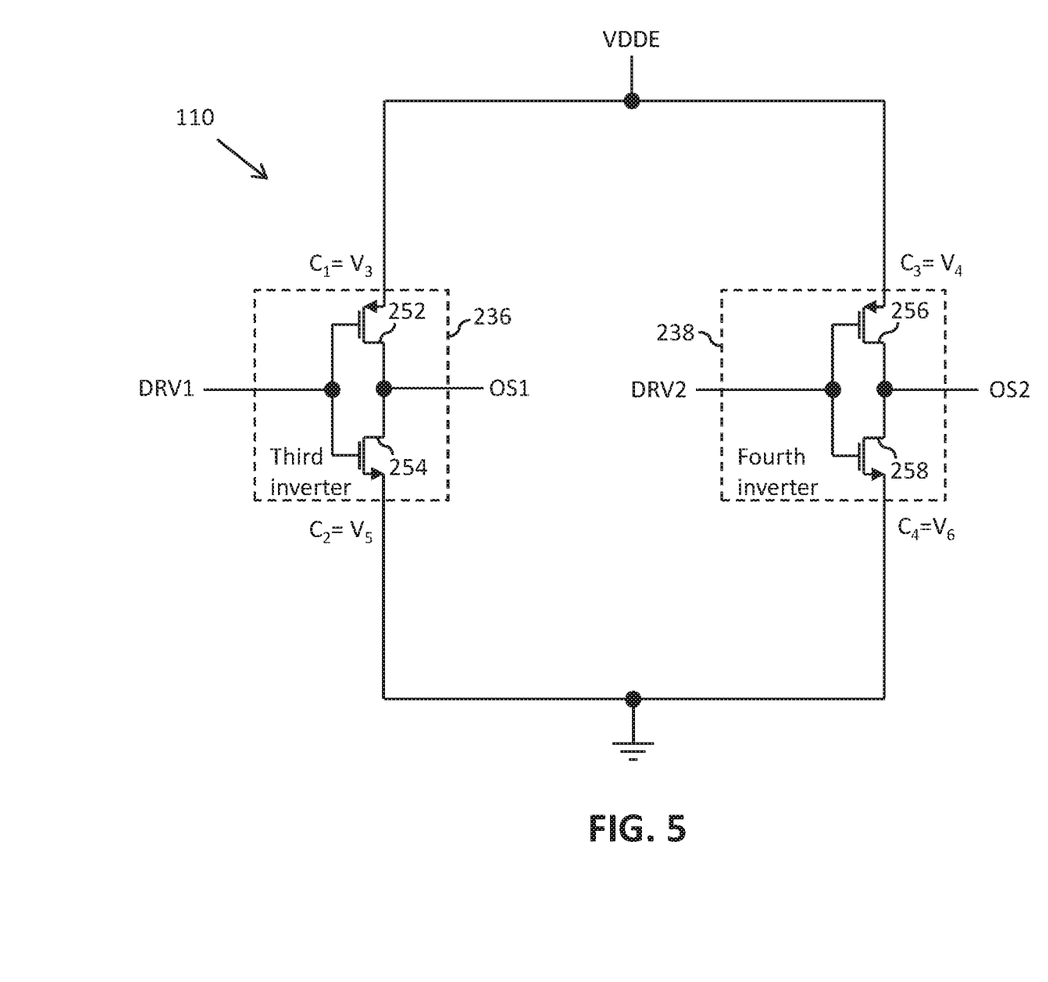
FIG. 5 is a schematic circuit diagram of the driver of FIG. 2 operating in a third mode, i.e., a single-ended voltage signaling mode, in accordance with an embodiment of the present invention.

Referring now to FIG. 5, a schematic circuit diagram of the driver 110 operating in the third mode, i.e., the single-ended voltage signaling mode, in accordance with an embodiment of the present invention, is shown. In the third mode, the first and second input signals IS1 and IS2 may be transmitted using various protocols such as a multiple function input /output (MFIO) protocol, a Serial Peripheral Interface (SPI) protocol, a Rambus Signaling Logic (RSL) protocol, a Pseudo Open Drain Logic (PODL) protocol, a General Purpose Input /Output (GPIO) protocol, and the like.

To set the driver circuit 110 to operate in accordance with the MFIO protocol, the third select signal MSEL3 is active and the first and second select signals MSEL1 and MSEL2 are inactive. Hence, the first and second switches 240 and 242 are disabled and the third switch 244 is enabled. Thus, the voltage level of the first voltage $V_1$ is at ground. When the first voltage $V_1$ is at ground, the first and second current sources 216 and 218 are enabled.

The fifth switch 248 is enabled, and the fourth and sixth switches 246 and 250 are disabled. Thus, the voltage level of the second voltage $V_2$ is equal to the supply voltage VDDE. When the second voltage $V_2$ equals VDDE, the first and second current sinks 224 and 226 are enabled.

As the second and third select signals MSEL2 and MSEL3 are inactive, the fourth select signal MSEL4 is inactive and /MSEL4 is active. Hence, the first and second transmission gates 232 and 234 are disabled. Thus, there is no current path between the third terminal of the third current source 220 and third terminal of the fourth current source 222. Further, there is no current path between the third terminal of the third current sink 228 and the third terminal of the fourth current sink 230.

In the third mode, the third and fourth current sources 220 and 222 and the third and fourth current sinks 228 and 230 are enabled. The first and second current sources 216 and 218 act as short circuits as the first and second current sources 216 and 218 receive the first voltage $V_1$, which is at ground. Thus, voltage levels of the first and third control signals $C_1$ and $C_3$ are at voltage levels of the third and fourth voltages $V_3$ and $V_4$, respectively. In one embodiment, the voltage levels of the third and fourth voltages $V_3$ and $V_4$ are equal to the voltage level of the supply voltage VDDE. In another embodiment, the voltage levels of the third and fourth voltages $V_3$ and $V_4$ are less than the voltage level of the supply voltage VDDE. Similarly, the first and second current sinks 224 and 226 act as short circuits, as the first and second current sinks 224 and 226 receive the second voltage $V_2$, which is at ground. Thus, voltage levels of the second and fourth control signals $C_2$ and $C_4$ are at voltage levels of the fifth and sixth voltages $V_5$ and $V_6$, respectively. In one embodiment, the voltage levels of the fifth and sixth voltages $V_5$ and $V_6$ are at ground.

In the MFIO protocol, the third input signal IS3 is high, hence the first driver signal DRV1 equals /IS1 and the second driver signal DRV2 equals /IS2. Thus, the first and second driver signals DRV1 and DRV2 are independent of each other.

When the first input signal IS1 is active, the first driver signal DRV1 is inactive, so the first transistor 252 is enabled and the second transistor 254 is disabled. Hence, the third inverter 236 outputs the first control signal $C_1$ as the first output signal OS1. When the first input signal IS1 is inactive, the first driver signal DRV1 is active, so the first transistor 252 is disabled and the second transistor 254 is enabled. Hence, the third inverter 236 outputs the second control signal $C_2$ as the first output signal OS1.

When the second input signal IS2 is active, the second driver signal DRV2 is inactive, so the third transistor 256 is enabled and the fourth transistor 258 is disabled. Hence, the fourth inverter 238 outputs the third control signal $C_3$ as the second output signal OS2. When the second input signal IS2 is inactive, the second driver signal DRV2 is active, so the third transistor 256 is disabled and the fourth transistor 258 is enabled. Hence, the fourth inverter 238 outputs the fourth control signal C4 as the second output signal OS2. Thus, the first and second output signals OS1 and OS2 are varying voltage signals.

Although FIG. 5 is explained with reference to the MFIO protocol, it will be apparent to a person skilled in the art that single-ended voltage signaling mode protocols can be implemented using the driver 110 by changing the values of the control signals (MSEL1-MSEL4). These controls signals may be considered as programmable because they can be generated by a controller or processor.

The driver 110 can be configured to operate in multiple signaling modes. Since the driver 110 is configurable to operate in three different modes, multiplexing the outputs of multiple drivers onto the IO pads 116 and 118, is not necessary. Since the outputs of multiple drivers are not multiplexed onto the IO pad, the load capacitance at the IO pad due to the driver 110 is significantly less than the load capacitance when the outputs of multiple drivers are multiplexed and connected to the IO pad. Reduced load capacitance improves the speed of operation of the driver 110, thereby improving the speed of operation of the IC 100.

The use of a single driver 110 that can operate in the first through third modes eliminates the need for having multiple IO pads corresponding to each driver output. Thus, the number of IO pads required by the driver 110 is less than drivers that have the multiple IO pads for each driver output. The reduction in the number of the IO pads means the circuitry consumes less space or chip real estate. Further, the design of the driver 110 is implemented using switches, current sources, current sinks, and inverters, which are not complex circuits, which means that the driver 110 can be readily integrated and configured into the IO ring 104. The driver 110 can be used in application areas requiring a single driver to operate in multiple signaling modes. Thus, the driver 110 can be used in communication devices such as mobile devices or automotive devices, such as car radar systems or car radios and the like, where the mode of operation is based on customer requirements and end product applications.

It will be understood by those of skill in the art that the same functions may be performed by different arrangements of transistors that may operate using either high active or low active signals. Therefore, variations in the arrangement of some of the transistors described above should not be considered to depart from the scope of the present invention. No element, act, or instruction used in the present application should be construed as critical or essential to the invention unless explicitly described as such. Further, the phrase "based on" is intended to mean "based, at least in part, on" unless explicitly stated otherwise.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A configurable driver that can operate in a plurality of modes, the driver comprising:

first and second sets of switches that receive a select input for enabling switching between first through third modes of the plurality of modes, and outputting first and second voltages, respectively;

first and second current sources connected to the first set of switches for receiving the first voltage, wherein the first and second current sources are disabled in the second mode and enabled in the first and third modes, and wherein the first and second current sources output first and second currents in the first mode, and third and fourth voltages in the third mode, respectively;

third and fourth current sources that receive a first predetermined bias voltage, and output third and fourth currents, respectively, wherein the third and fourth current sources are enabled in the first through third modes;

first and second current sinks connected to the second set of switches for receiving the second voltage, wherein the first and second current sinks are disabled in the second mode and enabled in the first and third modes, and wherein the first and second current sinks sink fifth and sixth currents in the first mode, and output fifth and sixth voltages in the third mode, respectively;

third and fourth current sinks that receive a second predetermined bias voltage and sink seventh and eighth currents, respectively, wherein the third and fourth current sinks are enabled in the first through third modes;

a first inverter that receives a first driver signal, is connected to the first and third current sources for receiving a first control signal, is connected to the first and third current sinks for receiving a second control signal, and outputs one of the first and second control signals as a first output signal; and a second inverter that receives a second driver signal, is connected to the second and fourth current sources for receiving a third control signal, is connected to the second and fourth current sinks for receiving a fourth control signal, and outputs one of the third and fourth control signals as a second output signal, wherein the first and second output signals are differential signals in the first mode, current signals in the second mode, and voltage signals in the third mode.

2. The driver of claim 1, wherein the first mode is a differential signaling mode, the second mode is a single-ended current signaling mode, and the third mode is a single-ended voltage signaling mode.

3. The driver of claim 1, further comprising:
a first transmission gate connected between the third and fourth current sources, wherein the first transmission gate is enabled in the first mode and disabled in the second and third modes; and
a second transmission gate connected between the third and fourth current sinks, wherein the second transmission gate is enabled in the first mode and disabled in the second and third modes.

4. The driver of claim 1, wherein the select input comprises first through third select signals, and wherein:
in the first mode, the first select signal is active and the second and third select signals are inactive, and voltage levels of the first and second voltages are at voltage levels of first and second bias voltages, respectively,
in the second mode, the second select signal is active and the first and third select signals are inactive, and the voltage level of the first voltage is at a voltage level of a supply voltage, and the voltage level of the second voltage is at ground, and
in the third mode, the third select signal is active and the first and second select signals are inactive, and the voltage level of the first voltage is at ground, and the voltage level of the second voltage is at the voltage level of the supply voltage.

5. The driver of claim 4, wherein the first and second sets of switches include first through third switches and fourth through sixth switches, respectively, and wherein:
the first switch has first and second terminals for receiving an inverted version of the first select signal and the first bias voltage, respectively,
the second switch has first and second terminals for receiving an inverted version of the second select signal and the supply voltage, respectively,
the third switch has a first terminal for receiving the third select signal, a second terminal connected to ground, and a third terminal connected to third terminals of the first and second switches for outputting the first voltage,
the fourth switch has first and second terminals for receiving the first select signal and the second bias voltage, respectively,
the fifth switch has first and second terminals for receiving an inverted version of the third select signal and the supply voltage, respectively, and
the sixth switch has a first terminal for receiving the second select signal, a second terminal connected to ground, and a third terminal connected to third terminals of the fourth and fifth switches for outputting the second voltage.

6. The driver of claim 1, wherein in the first mode:
a current level of the first control signal is a sum of current levels of the first through fourth currents,
a current level of the second control signal is a sum of current levels of the fifth through eighth currents,
a current level of the third control signal is the sum of the current levels of the first through fourth currents, and
a current level of the fourth control signal is the sum of the current levels of the fifth through eighth currents.

7. The driver of claim 1, wherein in the second mode:
a current level of the first control signal is at a current level of the third current,
a current level of the second control signal is at a current level of the seventh current,
a current level of the third control signal is at a current level of the fourth current, and
a current level of the fourth control signal is at a current level of the eighth current.

8. The driver of claim 1, wherein in the third mode:
a voltage level of the first control signal is at a voltage level of the third voltage,
a voltage level of the second control signal is at a voltage level of the fifth voltage,
a voltage level of the third control signal is at a voltage level of the fourth voltage, and
a voltage level of the fourth control signal is at a voltage level of the sixth voltage.

9. A configurable driver circuit, operable in a plurality of modes, that receives first and second input signals and generates first and second output signals, the driver circuit comprising:
a set of current sources connected to a supply voltage (VDDE) that generates first and third control signals (C1 and C3);
a set of current sinks connected to ground that generate second and fourth control signals (C2 and C4);
a first inverter connected between the set of current sources and the set of current sinks, wherein the first inverter receives the first and second control signals (C1 and C2) and the first input signal (DRV1), and generates the first output signal (OS1);
a second inverter connected between the set of current sources and the set of current sinks, wherein the second inverter receives the third and fourth control signals (C3 and C4) and the second driver signal (DRV2) and generates the second output signal (OS2);
a first set of switches connected to the set of current sources for providing a first voltage (V1) thereto, wherein the first set of switches receive a select input signal indicative of a mode of the plurality of modes of the driver circuit and determines a value of the first voltage, wherein a value of the first voltage enables and disables selected ones of the current sources of the plurality of current sources, thereby effecting a value of the first and third control signals (C1 and C3); and
a second set of switches connected to the set of current sinks for providing a second voltage (V2) thereto, wherein the second set of switches receive the select input signal indicative of the mode of the driver circuit and determines a value of the second voltage, wherein a value of the second voltage enables and disables selected ones of the current sinks of the plurality of current sinks, thereby effecting a value of the second and fourth control signals (C2 and C4);
wherein a first mode of the plurality of modes is a differential signaling mode, and the first and second output signals are differential signals,
wherein a second mode of the plurality of modes is a single-ended current signaling mode, and the first and second output signals are current signals, and
wherein a third mode of the plurality of modes is a single-ended voltage signaling mode, and the first and second output signals are voltage signals.

10. The configurable driver circuit of claim 9, wherein:
the first inverter comprises:
   a first transistor having a gate that receives the first input signal (DRV1), and a source that receives the first control signal (C1); and
   a second transistor having a gate the receives the first input signal (DRV1), a source that receives the second control signal (C2), and a drain connected to a drain of the first transistor, wherein the first output signal (OS1) is provided at a node between the drains of the first and second transistors; and
the second inverter comprises:
   a third transistor having a gate that receives the second input signal (DRV2), and a source that receives the third control signal (C3); and
   a fourth transistor having a gate the receives the second input signal (DRV2), a source that receives the fourth control signal (C4), and a drain connected to a drain of the third transistor, wherein the second output signal (OS2) is provided at a node between the drains of the third and fourth transistors.

11. The configurable driver circuit of claim 10, wherein:
the set of current sources comprises:
   a fifth transistor having a gate connected to the first set of switches for receiving the first voltage (V1), and a source that receives the supply voltage (VDDE);
   a sixth transistor having a gate that receives a first predetermined bias voltage (VPB1), a source that receives the first supply voltage (VDDE), and a drain connected to a drain of the fifth transistor, wherein the first control signal (C1) is generated at a node between the drains of the fifth and sixth transistors;
   a seventh transistor having a gate connected to the first set of switches for receiving the first voltage (V1), and a source that receives the supply voltage (VDDE); and
   an eighth transistor having a gate that receives the first predetermined bias voltage (VPB1), a source that receives the first supply voltage (VDDE), and a drain connected to a drain of the seventh transistor, wherein the third control signal (C3) is generated at a node between the drains of the seventh and eighth transistors; and
the set of current sinks comprises:
   a ninth transistor having a gate connected to the second set of switches for receiving the second voltage (V2), and a source connected to ground;
   a tenth transistor having a gate that receives a second predetermined bias voltage (VPB2), a source connected to ground, and a drain connected to a drain of the ninth transistor, wherein the second control signal (C2) is generated at a node between the drains of the ninth and tenth transistors;
   an eleventh transistor having a gate connected to the second set of switches for receiving the second voltage (V2), and a source connected to ground; and
   a twelfth transistor having a gate that receives the second predetermined bias voltage (VPB2), a source connected to ground, and a drain connected to a drain of the eleventh transistor, wherein the fourth control signal (C4) is generated at a node between the drains of the eleventh and twelfth transistors.

12. The configurable driver circuit of claim 11, wherein:
the select input signal comprises first through fourth select signals (MSEL1-MSEL4);
the first set of switches comprises:
   a thirteenth transistor having a gate that receives the first select signal (MSEL1), and a source that receives a first bias voltage (VB1);
   a fourteenth transistor having a gate that receives the second select signal (MSEL2) and a source that receives the supply voltage (VDDE); and
   a fifteenth transistor having a gate the receives the third select signal (MSEL3), a source connected to ground, and a drain connected to a first switch node connecting drains of the thirteenth and fourteenth transistors, wherein the first voltage (V1) is provided at said first switch node;
the second set of switches comprises:
   a sixteenth transistor having a gate that receives the first select signal (MSEL1), and a source that receives the second bias voltage (VB2);
   a seventeenth transistor having a gate that receives the third select signal (MSEL3) and a source that receives the supply voltage (VDDE); and
   an eighteenth transistor having a gate the receives the second select signal (MSEL2), a source connected to ground, and a drain connected to a second switch node connecting drains of the sixteenth and seventeenth transistors, wherein the second voltage (V2) is provided at said second switch node;
the set of current sources further comprises a first transmission connected between the drains of the sixth and eighth transistors, wherein the first transmission gate is controlled by the fourth select signal (MSEL4); and
the set of current sinks further comprises a second transmission gate connected between the drawings of the tenth and twelfth transistors, wherein the second transmission gate is controlled by the fourth select signal (MSEL4).

13. An integrated circuit (IC), comprising:
a pre-driver that receives first and second input signals, and outputs first and second driver signals, wherein the second driver signal is based on a third input signal; and
a driver connected to the pre-driver for receiving the first and second driver signals,
   wherein the driver outputs first and second output signals based on a select input,
   wherein the driver is configured to operate in a plurality of modes that include first through third modes, and
   wherein the first mode is a differential signaling mode, the second mode is a single-ended current signaling mode, and the third mode is a single-ended voltage signaling mode.

14. The IC of claim 13, wherein the driver includes first and second sets of switches, where the first and second sets of switches receive the select input for switching between the first through third modes, and outputting first and second voltages, respectively.

15. The driver of claim 14, wherein the select input comprises first through third select signals, and wherein:
   in the first mode, the first select signal is active and the second and third select signals are inactive, and voltage levels of the first and second voltages are at voltage levels of first and second bias voltages, respectively,
   in the second mode, the second select signal is active and the first and third select signals are inactive, and the voltage level of the first voltage is at a voltage level of a supply voltage, and the voltage level of the second voltage is at ground, and
   in the third mode, the third select signal is active and the first and second select signals are inactive, and the voltage level of the first voltage is at ground, and the voltage level of the second voltage is at the voltage level of the supply voltage.

16. The driver of claim 15, wherein the first and second sets of switches include first through third switches and fourth through sixth switches, respectively, and wherein:
the first switch has first and second terminals for receiving an inverted version of the first select signal and the first bias voltage, respectively,
the second switch has first and second terminals for receiving an inverted version of the second select signal and the supply voltage, respectively,
the third switch has a first terminal for receiving the third select signal, a second terminal connected to ground, and a third terminal connected to third terminals of the first and second switches for outputting the first voltage,
the fourth switch has first and second terminals for receiving the first select signal and the second bias voltage, respectively,
the fifth switch has first and second terminals for receiving an inverted version of the third select signal and the supply voltage, respectively, and
the sixth switch has a first terminal for receiving the second select signal, a second terminal connected to ground, and a third terminal connected to third terminals of the fourth and fifth switches for outputting the second voltage.

17. The IC of claim 14, wherein the driver further comprises:
first and second current sources connected to the first set of switches for receiving the first voltage, wherein the first and second current sources are disabled in the second mode and enabled in the first and third modes, and wherein the first and second current sources output first and second currents in the first mode, and third and fourth voltages in the third mode, respectively;
third and fourth current sources that receive a first predetermined bias voltage and output third and fourth currents, respectively, and wherein the third and fourth current sources are enabled in the first through third modes; and
a first transmission gate connected between the third and fourth current sources, wherein the first transmission gate is enabled in the first mode and disabled in the second and third modes.

18. The IC of claim 17, wherein the driver further comprises:
first and second current sinks connected to the second set of switches for receiving the second voltage, wherein the first and second current sinks are disabled in the second mode and enabled in the first and third modes, and wherein the first and second current sinks sink fifth and sixth currents in the first mode, and output fifth and sixth voltages in the third mode, respectively;
third and fourth current sinks that receive a second predetermined bias voltage and sink seventh and eighth currents, respectively, and wherein the third and fourth current sinks are enabled in the first through third modes; and
a second transmission gate connected between the third and fourth current sinks, wherein the second transmission gate is enabled in the first mode and disabled in the second and third modes.

19. The IC of claim 18, wherein the driver further comprises:
a first inverter that receives the first driver signal, is connected to the first and third current sources for receiving a first control signal, is connected to the first and third current sinks for receiving a second control signal, and outputs one of the first and second control signals as the first output signal; and
a second inverter that receives the second driver signal, is connected to the second and fourth current sources for receiving a third control signal, is connected to the second and fourth current sinks for receiving a fourth control signal, and outputs one of the third and fourth control signals as the second output signal, wherein the first and second output signals are differential signals in the first mode, the first and second output signals are current signals in the second mode, and the first and second output signals are voltage signals in the third mode.

20. The IC of claim 13, wherein:
the first driver signal is based on the first input signal in the first through third modes, and
the second driver signal is based on the first input signal in the first mode, and the second input signal in the second and third modes, and wherein the first and second driver signals are complementary signals in the first mode.

* * * * *